US008497550B2

(12) United States Patent
Juengling

(10) Patent No.: US 8,497,550 B2
(45) Date of Patent: Jul. 30, 2013

(54) MULTI-LEVEL DRAM CELL USING CHC TECHNOLOGY

(75) Inventor: Werner Juengling, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 233 days.

(21) Appl. No.: 13/046,798

(22) Filed: Mar. 14, 2011

(65) Prior Publication Data

US 2012/0236629 A1  Sep. 20, 2012

(51) Int. Cl.
*H01L 29/76* (2006.01)
(52) U.S. Cl.
USPC .......... 257/330; 257/296; 257/333; 257/332; 257/301; 257/329
(58) Field of Classification Search
USPC .............. 257/330, 296, 33, 332, 301, 329
See application file for complete search history.

(56) References Cited

U.S. PATENT DOCUMENTS

| 5,929,477 A * | 7/1999 | McAllister Burns, Jr. et al. ............... 257/306 |
| 6,077,745 A * | 6/2000 | Burns et al. .................... 438/270 |
| 6,114,725 A * | 9/2000 | Furukawa et al. ............. 257/330 |

\* cited by examiner

*Primary Examiner* — Long Pham
(74) *Attorney, Agent, or Firm* — Winston Hsu; Scott Margo

(57) ABSTRACT

A DRAM memory cell includes: a first finFET structure; and a second finFET structure adjacent to the first finFET structure. The second finFET structure includes: a source follower transistor in a first fin of the second finFET structure; an access transistor in a second fin of the second fin FET structure; a write word line; and a read word line stacked above the write word line. When the read word line is fired high, the source follower transistor enables data to be read from the first finFET structure.

3 Claims, 2 Drawing Sheets

MULTI-LEVEL DRAM CELL USING CHC TECHNOLOGY

BACKGROUND OF THE INVENTION

1. Field of the Invention

The present invention relates to DRAM cells, and more particularly, to DRAM cells that can comprise three transistors in a $4F^2$ cell area.

2. Description of the Prior Art

In the field of semiconductor memory, it is desirable to have as many devices in as small an area as possible. A number of structures and layouts are proposed in order to achieve this purpose. For example, some DRAM cells use stacked transistors to increase the number of transistors that can occupy a particular area. FinFET technology is another example of a particular technology that aids in the miniaturization of DRAM cells. FinFETs comprise two fins on either side of a trench where each fin has a source and drain on each side, and a gate formed over the fin.

A recent development in semiconductor technology is the miniaturization of a DRAM memory cell down to an area of $4F^2$, where F is a standard parameter used in the art. A typical cell will consist of a read word line, a write word line, a trench capacitor and a bit line/digit line for carrying charge. In most DRAM operations, the read cycle is destructive, meaning that the data will automatically need to be written back after the read has taken place. For a CMOS image sensor, however, the read cycle is not destructive. This allows the read process to take place very quickly. A CMOS image sensor, however, requires three transistors, which has an impact when miniaturization is desired.

It is therefore an objective in the art to create a high density DRAM that still occupies a minimum area.

SUMMARY OF THE INVENTION

A DRAM memory cell comprises: a first finFET structure; and a second finFET structure adjacent to the first finFET structure. The second finFET structure comprises: a source follower transistor in a first fin of the second finFET structure; an access transistor in a second fin of the second fin FET structure; a write word line; and a read word line stacked above the write word line. When the read word line is fired high, the source follower transistor enables data to be read from the first finFET structure.

These and other objectives of the present invention will no doubt become obvious to those of ordinary skill in the art after reading the following detailed description of the preferred embodiment that is illustrated in the various figures and drawings.

DETAILED DESCRIPTION

As is well-known in the art, a typical DRAM cell uses crosshair technology, with bit lines and word lines intersecting orthogonally. One finFET will have a read word line and a write word line that are stacked on top of each other, and are intersected by bit lines. An access transistor for writing will be on one side of the fin, and an access transistor for reading will be on the other side. When there is data at the bit line, the write word line is driven high to turn on the trench capacitor, so the capacitor will either charge or discharge. When the read word line is asserted, the read access transistor will read the data from the capacitor.

A CMOS image sensor requires three transistors, but it is difficult to utilize a layout that can have three transistors in a $4F^2$ cell layout. The present invention therefore provides a novel solution for achieving this objective.

Figure 1:
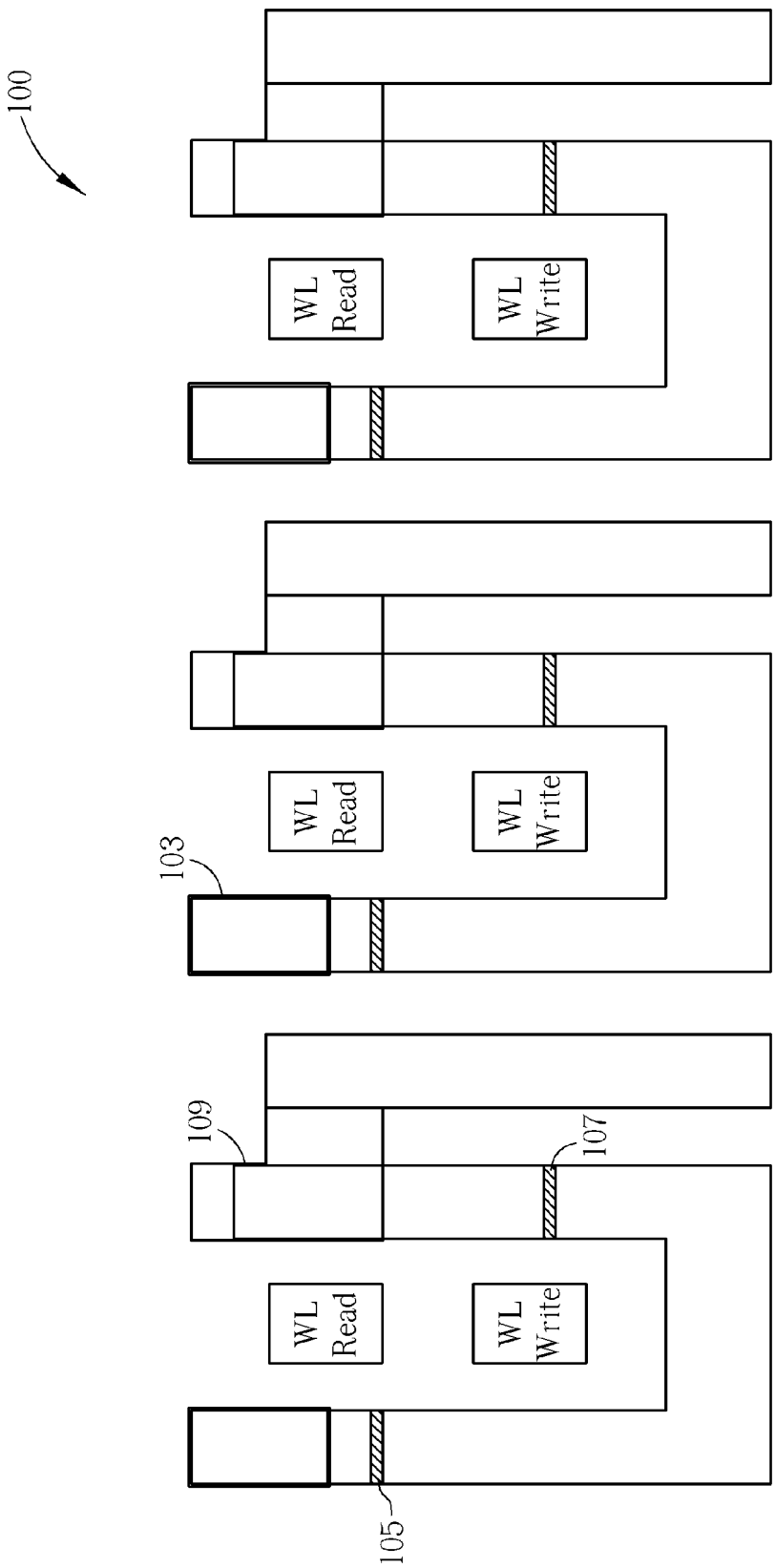
FIG. 1 is a diagram of a DRAM memory layout in an x-direction according to an exemplary embodiment of the present invention.

Please refer to FIG. 1. FIG. 1 is a layout of a number of finFETs of a DRAM memory 100 according to an exemplary embodiment of the present invention. As can be seen from the diagram, each finFET comprises a stacked read and write word line, a gate on each fin, and a source follower. Please note that this diagram is a slice taken in the x direction of a DRAM memory. The y direction is not shown as it resembles a standard crosshair layout.

In a typical finFET, the transistor on the left side of the finFET would be used for reading the trench capacitor by asserting the read word line, thereby allowing coupling across the bit line (not shown). The transistor on the right side of the finFET would be used for accessing the capacitor to allow it to charge or discharge according to data present on the intersecting bit line (not shown).

In the diagram shown in FIG. 1, the read process occurs differently. For a write process, the process is the same as the prior art, i.e. the write word line will be fired high, allowing current to travel through the right leg of the finFET and into the capacitor. For a read process, however, it will be the read word line of the adjacent finFET that accesses the capacitor. In other words, the complementary read word line of the first write word line is the middle read word line. This is made possible by the use of the source follower. The cell node at the top of the right fin is bigger than the gate, and n-type doped, which allows $N^+$ diffusion to occur. This parasitic coupling enables charge to travel across the connection and into the source follower. When the read word line of the next finFET is fired high, the read access transistor can access the charge in the capacitor owing to the parasitic coupling of the source follower.

This means that there is a diagonal coupling between what would be two adjacent cells that instead forms one cell with three transistors. This allows the multi-level storage in the capacitor which is required for CMOS image sensors, and further provides a high density DRAM.

Figure 2:
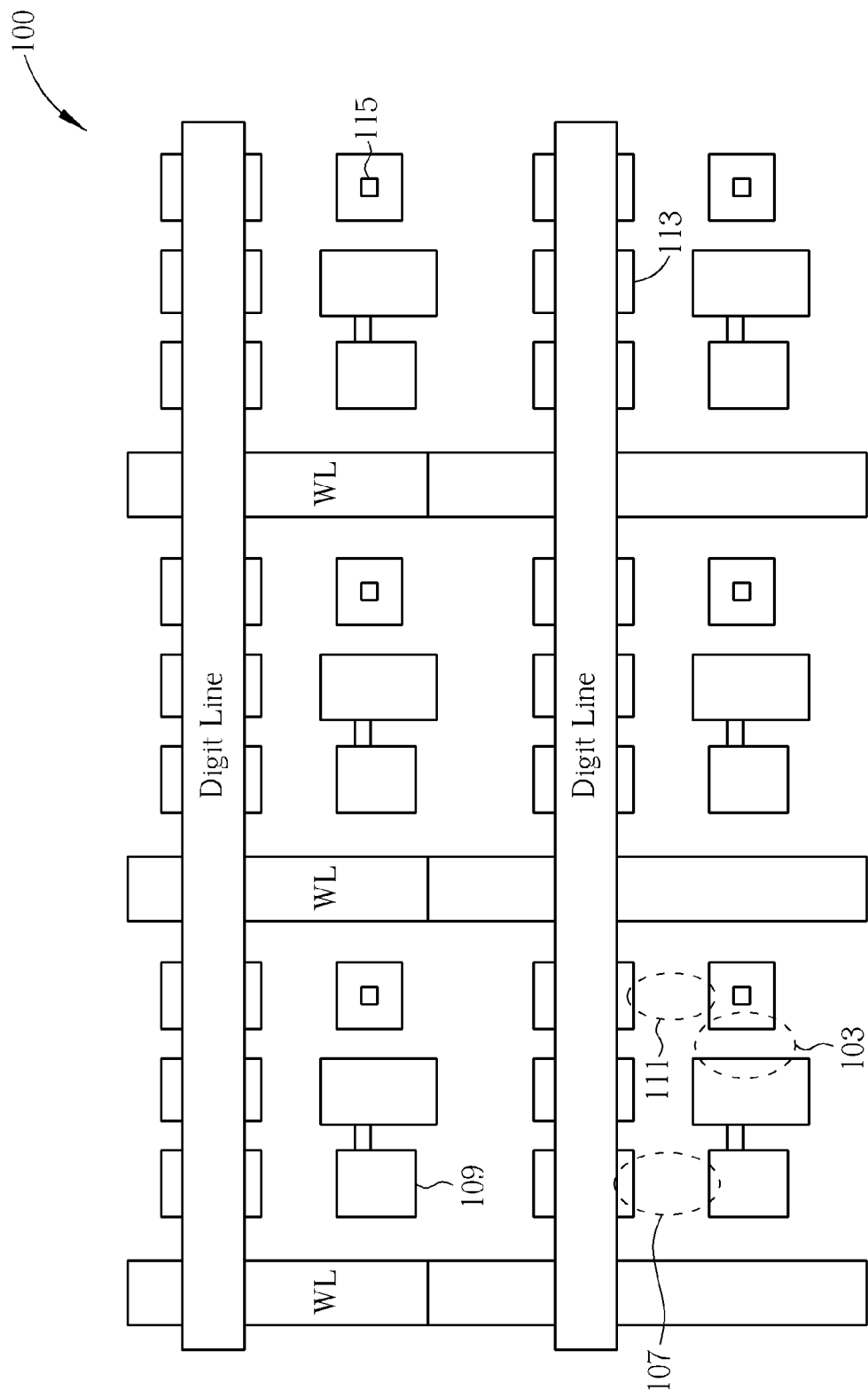
FIG. 2 is a top-down view of the DRAM memory layout shown in FIG. 1.

The spirit of the invention can be more clearly illustrated by referring to FIG. 2. FIG. 2 is a top-down view of the memory layout 100 shown in FIG. 1. FIG. 2 further shows the digit lines which intersect with the read and write word lines. Although they appear as one single line in this top-down view, the read and write word lines are stacked, with the read word line being on the top and the write word line being underneath (this is shown in FIG. 1).

Initially there is data on the bit line. The write word line is fired high which enables the access transistor to transfer the current on the bit line to the capacitor. The $N^+$ diffusion of the source follower will allow the charge stored to be transferred across. When the following read word line is fired high, this will turn on the access transistor for reading, and the parasitic coupling will allow the read word line to read what is stored in the capacitor.

The use of the source follower allows isolation between the read and write processes, so that fluctuations on the word lines will not affect the accurate readout of charge previously stored in the capacitor. It further enables an off-state of the read word line to be bypassed due to the high current.

Additionally, the use of the source follower means that one trench of the finFET will be used for the write and read access transistors, and the other will be used for the gate that allows the source follower and capacitor connections. The write and read access transistors can share the same trench as they are respectively used for different cells. This reduces crowding. Furthermore, the coupling between the access write transistor and the source follower, and the parasitic coupling across the source follower and the access transistor for reading means that, at any time, only the side of the transistor that is facing the word line needs to be active.

In this way, a DRAM cell with three transistors can be constructed to occupy a $4F^2$ area.

Those skilled in the art will readily observe that numerous modifications and alterations of the device and method may be made while retaining the teachings of the invention.

What is claimed is:

1. A DRAM memory cell, comprising:
   a first finFET structure, having a U-shaped cross-section and comprising:
      a first fin;
      a second fin opposite to the first fin;
      a trench disposed between the first fin and the second fin; and
      a trench capacitor for storing charge; and
   a second finFET structure adjacent to the first finFET structure, the second finFET structure having a U-shaped cross section and comprising:
      a first fin, comprising:
         a source follower transistor; and
         an n-doped region above the source follower transistor;
      a second fin opposite to the first fin and comprising:
         an access transistor;
      a trench capacitor, for storing charge;
      a trench disposed between the first fin and the second fin of the second finFET structure;
      a write word line disposed in the trench; and
      a read word line disposed in the trench and stacked above the write word line;
   wherein when the read word line of the second finFET structure is fired high, parasitic coupling between the n-doped region of the first fin of the second finFET structure and the trench capacitor of the first finFET structure enables data to be read from the first finFET structure.

2. The DRAM memory cell of claim 1, being a CMOS imager.

3. The DRAM memory cell of claim 1, having an area of $4F^2$,
   wherein F is a standard parameter.

* * * * *